United States Patent
Ovens et al.

(10) Patent No.: US 6,351,173 B1
(45) Date of Patent: Feb. 26, 2002

(54) CIRCUIT AND METHOD FOR AN INTEGRATED LEVEL SHIFTING LATCH

(75) Inventors: Kevin M. Ovens, Plano; Thomas C. Shinham, Rowlett, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/648,721

(22) Filed: Aug. 25, 2000

(51) Int. Cl.[7] .......................................... H03K 19/0185
(52) U.S. Cl. .......................................... 327/333; 326/81
(58) Field of Search ........................... 327/333; 326/80, 326/81

(56) References Cited

U.S. PATENT DOCUMENTS

| | | | |
|---|---|---|---|
| 5,892,385 A | * 4/1999 | Hashiguchi | 327/333 |
| 5,910,735 A | * 6/1999 | Allen | 326/93 |
| 5,973,549 A | * 10/1999 | Yuh | 326/81 |
| 6,025,737 A | 2/2000 | Patel et al. | 326/80 |

OTHER PUBLICATIONS

Metha, Deepal & Lau, William, "Advanced I/O Still Comes Up Short," Electronic Engineering Times, May 22, 2000, p. 103.

* cited by examiner

*Primary Examiner*—Toan Tran
(74) *Attorney, Agent, or Firm*—Dwight N. Holmbo; Wade James Brady, III; Frederick J. Telecky, Jr.

(57) ABSTRACT

An integrated circuit (IC) comprising an integrated level shifting latch for I/O. The level shift in the IC I/O section may be clocked. In addition, a latch may be moved from the core section to the I/O section of the device, and thus the incoming clock may remain in the external voltage domain to clock the latch along with the level shift. The level shift and latch may be clocked on opposite phases of the clock. Preferably, the level shift and latch may operate differentially on the data signal. Both setup and clock-to-Q times are significantly reduced with respect to prior art devices, allowing higher speed industry specifications may be met.

16 Claims, 6 Drawing Sheets

| FIGURE_2 NON-INTEGRATED | SLEW (ns) | SETUP (ns) | HOLD (ns) | CLK-QHL (ns) | CLK-QLH (ns) | SETUP + CLK-QHL (ns) | SETUP + CLK-QLH (ns) | SETUP + HOLD (ns) |
|---|---|---|---|---|---|---|---|---|
| WEAK 1.65V/3.00V 125C | 0.0200 | 1.0413 | -0.4199 | 1.1704 | 1.2691 | 2.2117 | 2.3104 | 0.6214 |
|  | 0.4000 | 0.9387 | -0.5310 | 0.8466 | 0.9435 | 1.7853 | 1.8822 | 0.4077 |
|  | 1.0000 | 0.8191 | -0.6335 | 0.5960 | 0.6907 | 1.4151 | 1.5098 | 0.1856 |
| STRONG 1.95V/3.60V -40C | 0.0200 | 0.3491 | -0.0354 | 0.7546 | 0.8023 | 1.1037 | 1.1514 | 0.3137 |
|  | 0.4000 | 0.3064 | -0.1038 | 0.4599 | 0.5117 | 0.7663 | 0.8181 | 0.2026 |
|  | 1.0000 | 0.2637 | -0.1892 | 0.2335 | 0.2868 | 0.4972 | 0.5505 | 0.0745 |
| NOMINAL 1.80V/3.30V 25C | 0.0200 | 0.5969 | -0.1807 | 0.8776 | 0.9493 | 1.4745 | 1.5462 | 0.4162 |
|  | 0.4000 | 0.5115 | -0.2490 | 0.5853 | 0.6604 | 1.0968 | 1.1719 | 0.2625 |
|  | 1.0000 | 0.4346 | -0.3345 | 0.3546 | 0.4273 | 0.7892 | 0.8619 | 0.1001 |

| FIGURE_3 INTEGRATED | SLEW (ns) | SETUP (ns) | HOLD (ns) | CLK-QHL (ns) | CLK-QLH (ns) | SETUP + CLK-QHL (ns) | SETUP + CLK-QLH (ns) | SETUP + HOLD (ns) |
|---|---|---|---|---|---|---|---|---|
| WEAK 1.65V/3.00V 125C | 0.0200 | 0.5713 | -0.0696 | 1.2664 | 1.2639 | 1.8377 | 1.8352 | 0.5017 |
|  | 0.4000 | 0.4431 | -0.1294 | 0.9369 | 0.9327 | 1.3800 | 1.3758 | 0.3137 |
|  | 1.0000 | 0.3235 | -0.2063 | 0.6838 | 0.6773 | 1.0073 | 1.0008 | 0.1172 |
| STRONG 1.95V/3.60V -40C | 0.0200 | 0.3662 | 0.0073 | 0.8041 | 0.8047 | 1.1703 | 1.1709 | 0.3735 |
|  | 0.4000 | 0.1697 | -0.0696 | 0.4979 | 0.5031 | 0.6676 | 0.6728 | 0.1001 |
|  | 1.0000 | 0.0586 | -0.1465 | 0.2656 | 0.2719 | 0.3242 | 0.3305 | -0.0879 |
| NOMINAL 1.80V/3.30V 25C | 0.0200 | 0.4089 | -0.0525 | 0.9362 | 0.9461 | 1.3451 | 1.3550 | 0.3564 |
|  | 0.4000 | 0.2637 | -0.1038 | 0.6374 | 0.6498 | 0.9011 | 0.9135 | 0.1599 |
|  | 1.0000 | 0.1526 | -0.1636 | 0.4038 | 0.4748 | 0.5564 | 0.6274 | -0.0110 |

CIRCUIT AND METHOD FOR AN INTEGRATED LEVEL SHIFTING LATCH

TECHNICAL FIELD

The present invention relates generally to integrated circuits, and more particularly to level shifting between a core voltage and an I/O voltage on an integrated circuit.

BACKGROUND

The semiconductor industry is continually driven to reduce cost, reduce power, and improve performance (e.g., circuit speed) of integrated circuits ("IC"s). Integrated circuit products include application specific integrated circuits ("ASIC"s), microprocessors, digital signal processors, memories, programmable logic, programmable controllers, and many other types of integrated circuits. Generally, price reduction is strongly driven by migrating products to scaled processes, which reduce die sizes and increase yields. Power reduction has generally been achieved by circuit design techniques, power management schemes, and parasitic scaling, among other factors. Performance improvement has generally resulted from design techniques, process enhancements, and parasitic scaling, among other factors.

Process technology continues to improve, resulting in the continual scaling and shrinking of device geometries, sizes and dimensions. Smaller devices generally require that operating voltages be scaled down to reduce the voltage differences across device components. Accordingly, operating voltages have been scaled from 5 volts down to 3.3 volts and further down to 1.8 volts, and generally will continue to decrease in the future (e.g., to 0.9 volts or less). This has resulted in the need for mixed-voltage-mode systems because not all components are scaled down at the same time. That is, integrated circuits may need to interface with various operating voltages as these and further voltage reductions are made. Currently, the industry generally provides products and printed circuit boards (PCBs) that may utilize 5 volt, 3.3 volt and 1.8 volt integrated circuits and devices. Generally, there may be a considerable transition period for the standard power supply to switch from a higher voltage level to a lower voltage level.

As an example, there is generally a current need in integrated circuits such as ASICs to transfer data between 1.8 volts in the core section of the device and 3.3 volts in the input/output ("I/O") section of the device. It takes a certain amount of time, however, to accomplish the voltage level shifts into and out of devices. As speed requirements generally continue to increase for these devices, there is an increasing need for IC designers and manufacturers to reduce the time taken by an IC to level shift a received signal, process it, and level shift it for output.

As an example, the timing specifications for the PCI-66 MHz computer bus were difficult for IC designers to meet, and now the timing specifications for the new PCI-X 133 MHz or 166 MHz computer buses appear to be extremely difficult to meet with prior art techniques. The PCI-133 MHz specification generally permits approximately 1 Gbyte/sec performance, which is double the bandwidth of the PCI-66 MHz specification. The PCI-X specification generally has very tight timing requirements for the I/O interface. For example, it requires a maximum of 1.2 ns for the setup time and a maximum of 3.8 ns for the clock-to-Q output delay in an ASIC. As indicated by Deepal Mehta, Advanced I/O Still Comes Up Short, ELECTRONIC ENGINEERING TIMES, May 22, 2000, at 103, there is generally a great need in the industry to meet this new specification because most major server, personal computer ("PC"), and PC board manufacturers desire to use devices with the faster PCI-X buffers.

SUMMARY OF THE INVENTION

These and other problems are generally solved or circumvented, and technical advantages are generally achieved, by preferred embodiments of the present invention in which an integrated level shifting latch is used for integrated circuit I/O. The level shift in the IC I/O section may be clocked. In addition, a latch may be moved from the core section to the I/O section of the device, and thus the incoming clock may remain in the external voltage domain to clock the latch along with the level shift. Preferably, the level shift and latch may be clocked on opposite phases of the clock. Also preferably, the level shift and latch may operate differentially on the data signal.

In accordance with a preferred embodiment of the present invention, an IC comprises a clocked level shifter, wherein the level shifter shifts data from a core voltage level to an I/O voltage level, and a clocked latch coupled an output of the level shifter, wherein the latch captures the data at the I/O voltage level. Preferably, the level shifter is a differential level shifter and the latch is a differential input latch receiving the data output from the level shifter. Also preferably, the level shift and the latch are accomplished on opposite phases of the clock.

In accordance with another preferred embodiment of the present invention, a method for providing data at an output of an IC comprises level shifting the data from a core voltage level to an I/O voltage level synchronous to an external clock, and latching the data at the I/O voltage level synchronous to the external clock. Preferably, the level shifting and the latching are performed differentially. Also preferably, the level shifting and latching are performed on opposite phases of the clock.

An advantage of a preferred embodiment of the present invention is that both setup and clock-to-Q times are significantly reduced with respect to prior art devices.

Another advantage of a preferred embodiment of the present invention is that higher speed industry specifications may be met. In particular, a preferred embodiment of the present invention may readily meet the PCI-X 133 MHz bus specifications, which are very difficult or even impossible to meet with prior art designs.

A further advantage of a preferred embodiment of the present invention is that fewer devices (e.g., transistors) are needed to implement the level shift and latch functions than in the prior art, thus saving valuable space on an integrated circuit.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely latching data between a 1.8 volt core environment and a 3.3 volt I/O environment in an ASIC. As used herein, the term latch is defined to include a flip-flop. The invention may be applied, however, to other types of ICs, or to any level shifting environment that has data being shifted between the core and the I/O. In addition, the invention may be used anywhere there is an interface from one or more voltages to one or more other voltages. Typically, the invention may be applied between a higher I/O voltage and a lower core voltage, but it may also be applied with a lower I/O voltage and a higher core voltage, or the two voltages may be the same voltage level, but different in another way. For example one voltage may be quiet and the other noisy.

Figure 1:
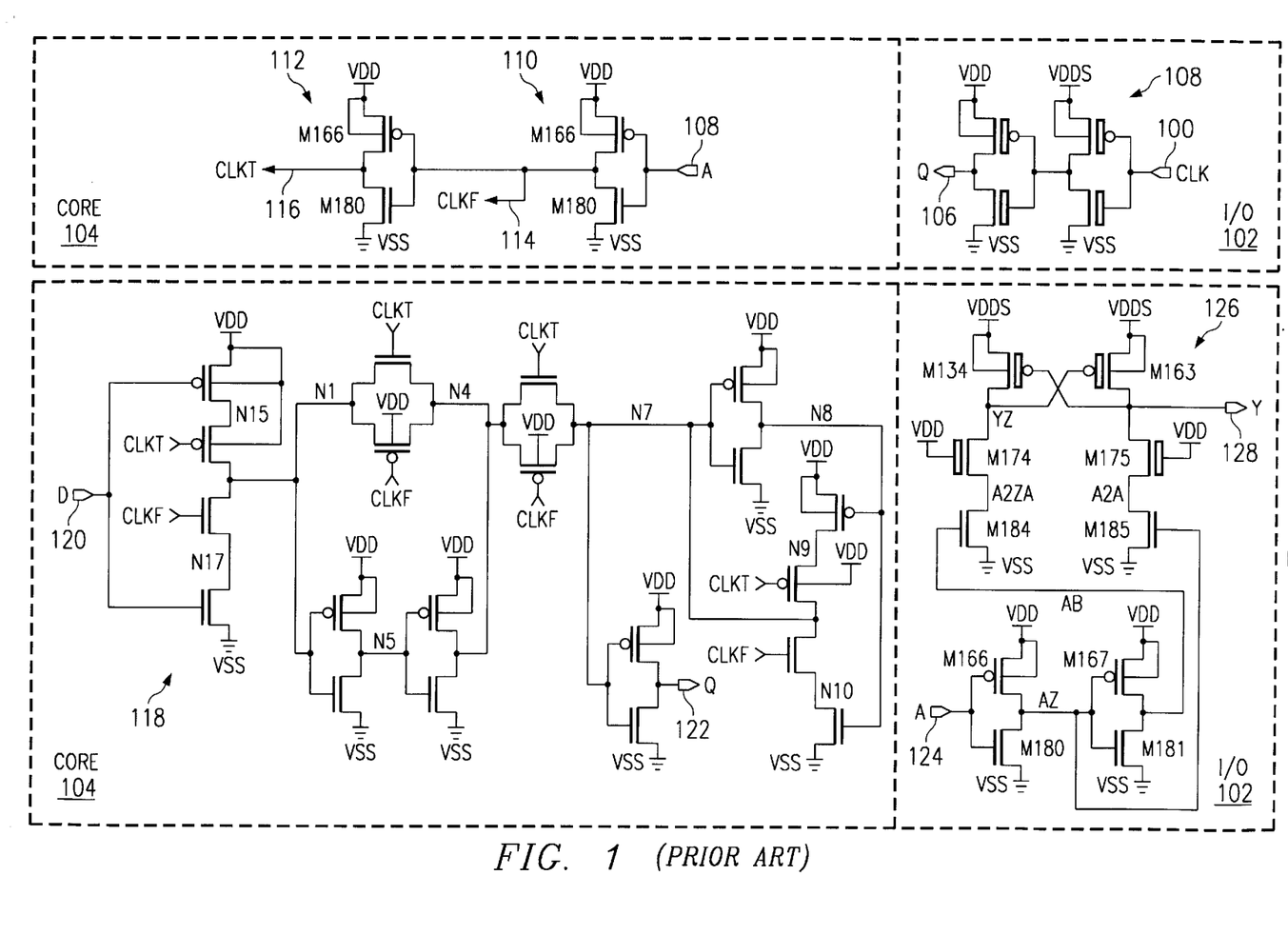
FIG. 1 is a schematic diagram of a prior art core latch and I/O level shift.

With reference now to FIG. 1, there is shown a schematic diagram of a typical prior art core latch and I/O level shift circuit in an ASIC. External 3.3v clock signal 100 is received at I/O section 102 of the ASIC, where it is level shifted down to 1.8v clock signal 106 by clock level shifter 108 in order to match the IC core voltage level. VDDS represents supply voltage 3.3v, and VDD represents the core voltage 1.8v. This level shift typically takes about 750 ps.

There is a routing connection from 1.8v clock signal 106 in I/O section 102 to 1.8v clock signal 108 in core section 104. Generally, there is also another buffer (not shown) inserted between clock signal 106 and clock signal 108 which is a Clock Tree Synthesis ("CTS") buffer. Generally, the purpose of the buffer is to equalize all of the clock delays. The minimum delay added by the CTS buffer is generally about 0.5 ns. 1.8v clock signal 108 is fed through inverter 110 and inverter 112 to produce false 1.8v clock 114 and true 1.8v clock 116, respectively, which are then used to clock circuitry in core section 104.

1.8v latch 118 is located in core section 104, and captures data in the core from node D 120 to node Q 122, using true clock 116 and false clock 114. There is a routing connection, and possibly another cause of delay, from node Q 122 in core section 104 to node A 124 in 110 section 102. Data captured at node Q 122 by clocked latch 118 is then level shifted back up the peripheral or interface voltage of 3.3v by data level shifter 126. The level shift to 3.3v typically takes about 1.5 ns. Node Y output 128 from level shifter 126 typically goes to an output buffer (not shown), and not directly to the output pin of the IC, so there is another level of logic causing more delay. The setup time of the latch and the level shift out of the core take a relatively long time to accomplish (e.g., about 2 ns).

Generally, a critical requirement for the PCI-X buffer is that the time from clock input at 3.3volts to the 3.3 volt output after the added buffer (after node Y 128) is about 3.8 ns. For a PCI-66 buffer using this same basic flow, the required time is about 7 nanoseconds, so the PCI-X specification significantly decreases the allowed delay. Generally, all of the delays involved with this circuit design—the input level shifter, the CTS buffer, the setup time on the core latch, the output level shifter, and the output buffer-make it very difficult for an IC designer or manufacturer to meet the PCI-X set up and clock-to-Q requirements.

Figure 2:
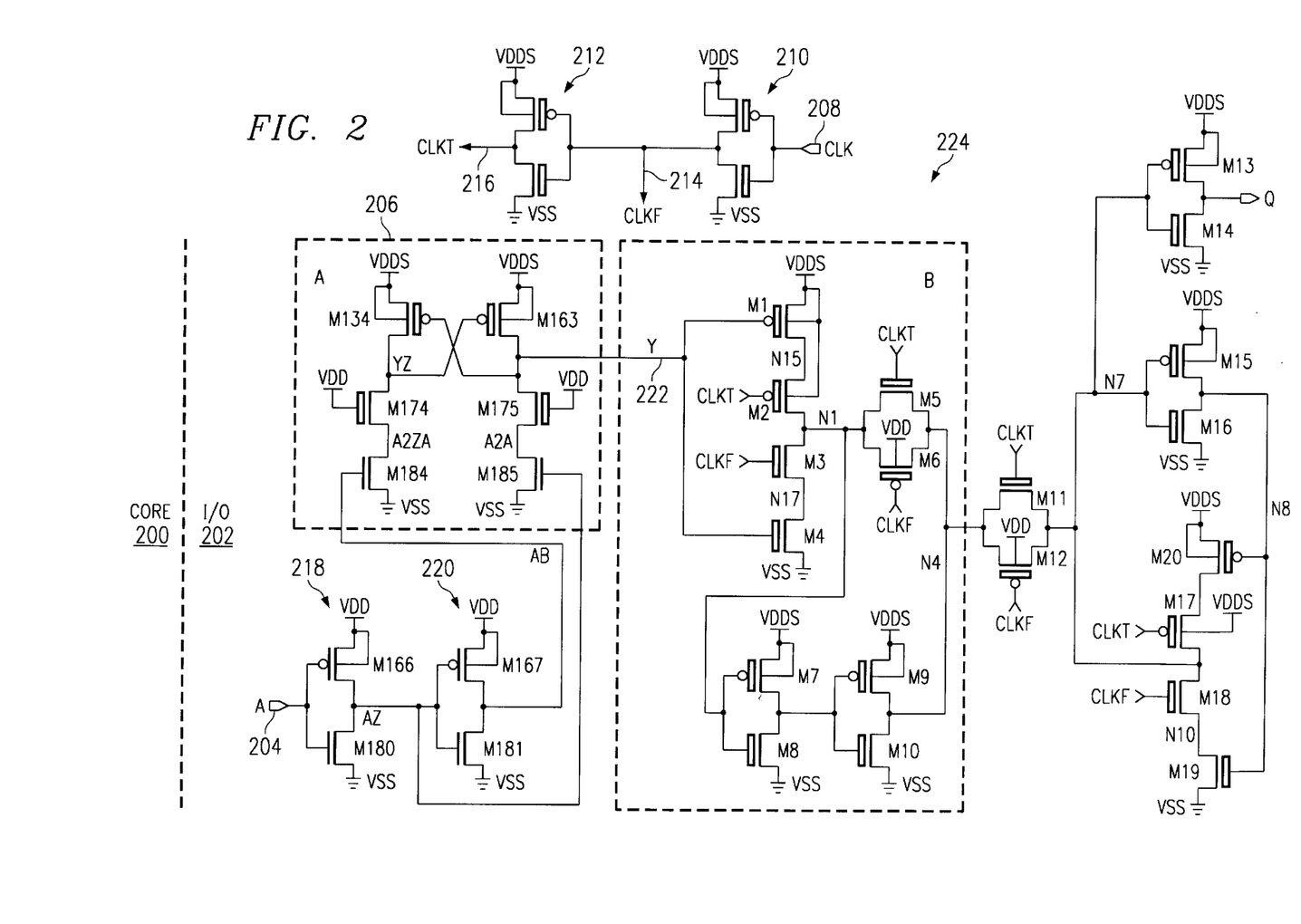
FIG. 2 is a schematic diagram of an I/O level shift and latch.

With reference now to FIG. 2, there is shown a schematic diagram of an I/O level shift and latch circuit, which generally provides some improvement, but with tradeoffs, over the circuit of FIG. 1. In the circuit of FIG. 2, the latch is moved from the core section to the I/O section, thereby removing the delay caused by level shifting the clock down to the core voltage for the latch. Generally, this has the effect of making the clock-to-Q time faster than the circuit of FIG. 1.

External 3.3v clock 208 is received by the IC and fed through inverter 210 and inverter 212 to produce false 3.3v clock 214 and true 3.3v clock 216, respectively. In contrast to the circuit of FIG. 1, the clock remains in the 3.3v domain for the clocking of the data latch.

1.8v level data comes from core section 200 into I/O section 202 at node A 204. Also in contrast to the circuit of FIG. 1, the data is now level shifted from 1.8v up to 3.3v in level shifter 206 before it is latched. Level shifter 206 is a differential type level shifter, hence the use of inverters 218 and 220. Single ended level shifted data 222 is then provided to 3.3v latch 224. The 3.3v clocks may now directly clock the 3.3v latch without a level shift on the clock, and without a level shift on the data after the latch.

By moving the latch to the I/O section, the circuit of FIG. 2 provides an improvement over the circuit of FIG. 1 because the clock-to-Q time is decreased to about 1.0–1.5 ns. This improvement is part of a tradeoff, however, because it also has the effect of increasing the set up time by about 1.2 ns.

Figure 3:
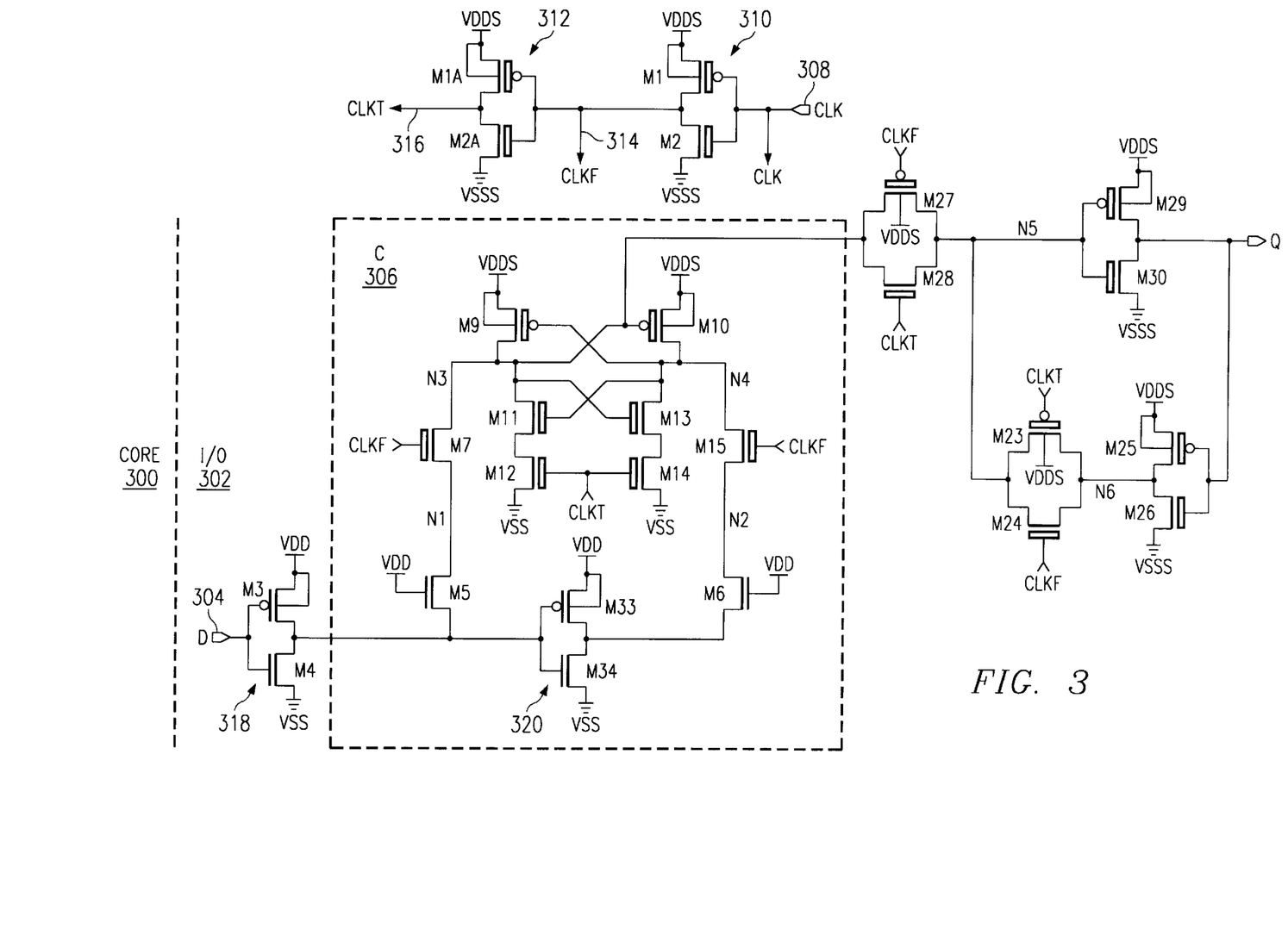
FIG. 3 is a schematic diagram of a clocked I/O level shift and differential latch.

With reference now to FIG. 3, the set up and core level shift times can be significantly reduced by making some modifications to the latch and to the level shifter of FIG. 2, and then merging the two. Specifically, dashed section A in FIG. 2, containing the level shift, and dashed section B in FIG. 2, containing the master latch section of the master/slave flip-flop, are modified and merged into dashed section C in FIG. 3. With this integrated level shifting latch, the PCI-X buffer may be able to easily meet the PCI-X specifications and beyond, to 200 MHz or even 300 MHz or more.

External 3.3v clock 308 is received by the IC and fed through inverter 310 and inverter 312 to produce false 3.3v clock 314 and true 3.3v clock 316, respectively. Like the circuit of FIG. 2, the clock remains in the 3.3v domain for the clocking of the data latch.

1.8v data from core section 300 is provided to 1/O section 302 at D input 304. The data goes through two 1.8v inverters, 318 & 320 before going to the differential level shifter comprising transistors M5, M6, M7, M9, M10 and M15. The differential level shifter is generally the same as level shifter 206, but with some changes that significantly improve the timing over the circuit of FIG. 2. First, low voltage transistors M5 and M6 now have their gates connected to VDD instead of the true and false data inputs. Second, the gates of high voltage transistors M7 and M15 are now connected to the false clock instead of VDD, making the level shifter shift data when the false clock is high.

Also in contrast to FIG. 2, both differential outputs at node N3 and N4 from the level shifter are fed as differential inputs to the latch. The differential latch comprises transistors M11, M12, M13 and M14. The gates of transistors M12 and M14 are connected to the true clock, and turn on when the true clock is high, enabling transistors M11 and M13 to capture data in the latch based on the differential input signal. The captured data is output from the latch at node N3 to a pass-gate that goes to the slave portion of the flip-flop.

The master latch comprising transistors M11–M14 basically performs the same function as dashed section B in FIG. 2. Because the false clock level is used to shift data, and the true clock level is used to latch data, several transistors from FIG. 2 are not needed. As can be seen in FIGS. 2 and 3, the same function is provided by 4 transistors in FIG. 3 that took 10 transistors in FIG. 2. Instead of the master latch being implemented with pass gates, it uses a cross-coupled pair of floating NMOS transistors, M11 & M13, connected to ground through a second pair of NMOS transistors, M12 & M14. Data is latched when the clock signal on the second pair of NMOS transistor gates M12 & M14 is switched to a logic "1."

By merging the level shifter and master latch section of a master/slave flip-flop, the time involved to level shift and latch a "1" or a "0" in the master latch may be less than the time needed to just latch with the prior art flip-flop. The merging of components also decreases the flip-flop setup and hold window. Generally, the core transistor delays are much faster by going from a single-ended environment to a differential environment with the core transistors. In addition, by clocking the level shifter on one phase of the clock and clocking the latch on the other phase of the clock, the two functions may be integrated and made to be much faster than when operated separately.

Figure 5:
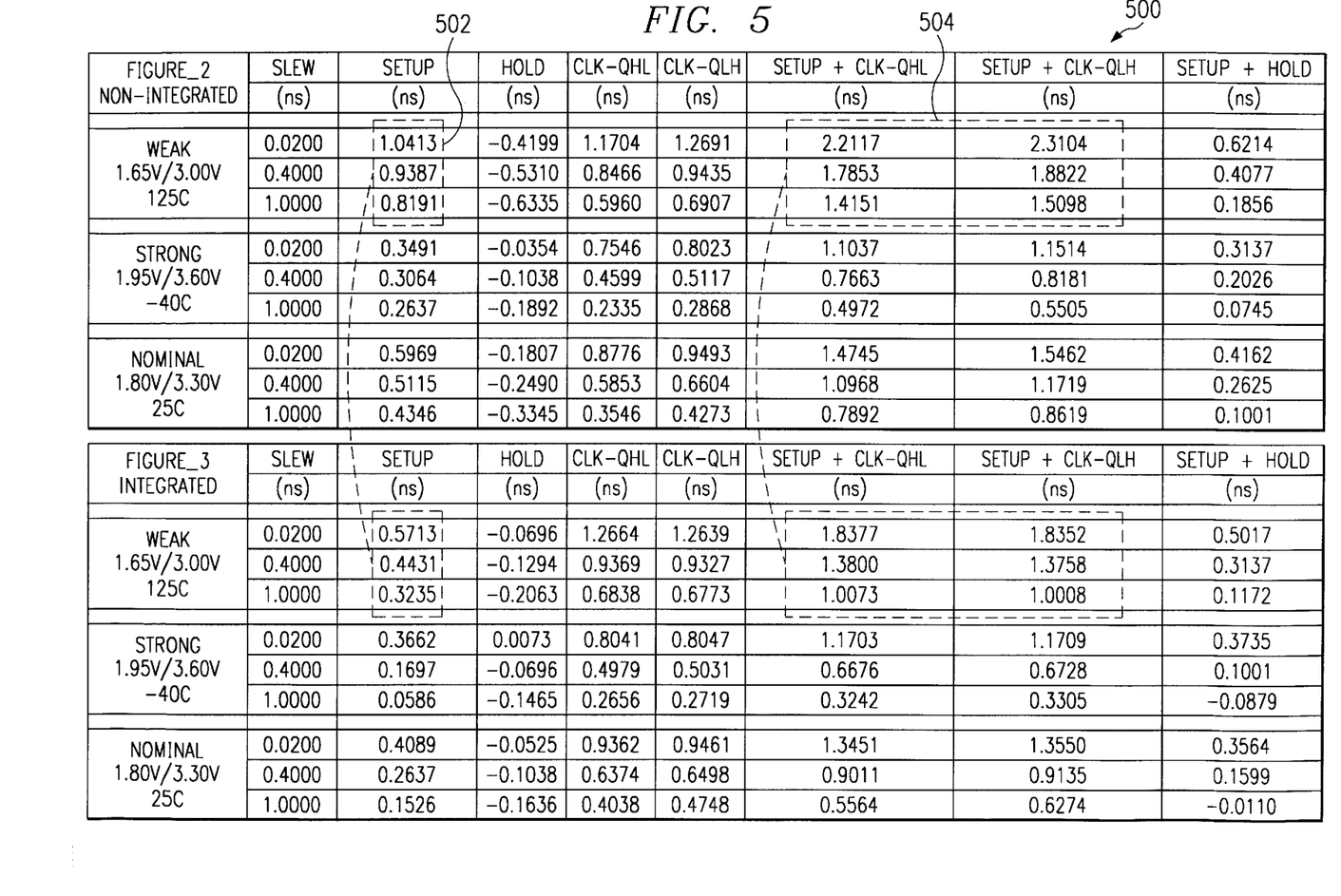
FIG. 5 is a table of timing data comparing a non-integrated and a integrated level shifter/latch.

As an example, as shown in the table of FIG. 5, the non-integrated latch setup time under weak conditions with 1 ns slew is 0.8181 ns. In going to the integrated level shifting latch of FIG. 3, the setup time actually dropped down to about 0.3235 ns, decreasing by a factor of about 3. Note that this is with a light load on the master latch output, and that with heavier loads, greater than 3 times improvement may be made. This substantial drop may be the result of immediately going to a differential data signal in the 1.8v environment, and keeping that differential signal into the capture phase of the latch. Generally, the differential latch captures data much faster than a single-ended latch, because only a minor differential change in the true and the compliment data (e.g., a 2- or 3-millivolt difference between nodes 3 & 4) is needed. In contrast, in FIG. 2, single-ended node N5 must go past the voltage threshold to a reasonable logic level in order to capture data on the single-ended latch. Integrating a clocked level shifter with a clocked master latch, and using differential logic, allows a setup time of about 200 ps or lower to be achieved.

Figure 4A:
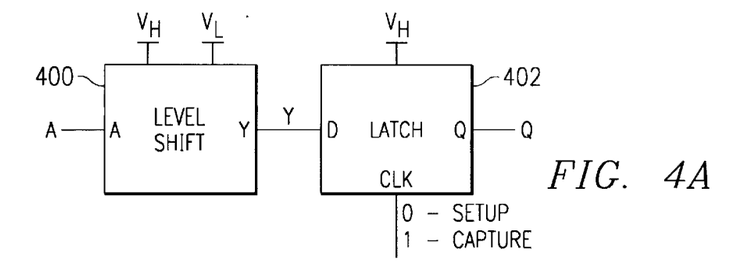
FIGS. 4a, 4b and 4c are block diagrams of various level shift/latch implementations.
Figure 4B:
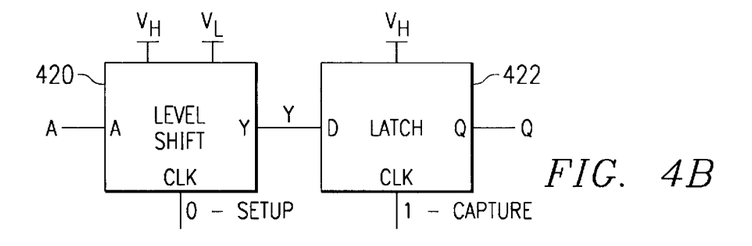
Figure 4C:
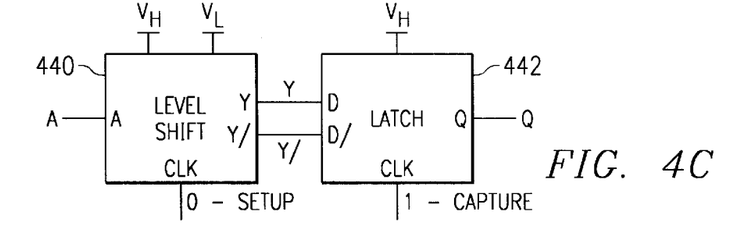

The progression of the circuit is generally shown in the block diagrams of FIGS. 4a, 4b and 4c. FIG. 4a represents a non-integrated level shifter 400 and latch 402. While latch 402 has been moved to the high voltage I/O section to improve the clock-to-Q time, it still requires a significant setup time. In FIG. 4b, level shifter 420 is made to be a clocked level shifter on the opposite phase of the clock from latch 422. However, the circuit still uses a single-ended output from the level shifter to latch 422. In FIG. 4c, level shifter 440 and latch 442 are fully integrated. A differential-type signal is used for the data from the core voltage all the way to high voltage latch input. The combination of the clocked level shifter and the differential data capture forming the integrated level shifting latch provides significant and synergistic reductions in clock-to-Q time and set up time for the circuit.

Table 500 shown in FIG. 5 illustrates the substantial timing improvements for the integrated level shifting latch over the non-integrated level shifting latch. For example, under weak conditions 502, the setup time is about 500 ps faster. This results in a setup time plus clock-to-Q time 504 that is also about 500 ps faster. Because the data is being setup faster, this allows the flip-flop to be clocked sooner, which results in data getting to the output faster.

It has also been discovered that prior art level shifters have other disadvantages. For example, level shifting from a lower voltage (e.g., 1.8 volts) to one or more higher voltages (e.g., 3.3 or 5.0 volts) may be causing gate oxide integrity problems in low voltage transistors. Typically, during power up of an electronic device, the higher voltage supply VDDS powers up first. The lower voltage supply, generally generated from the higher voltage supply, then may take a few milliseconds to power up the lower voltage VDD.

Figure 6:
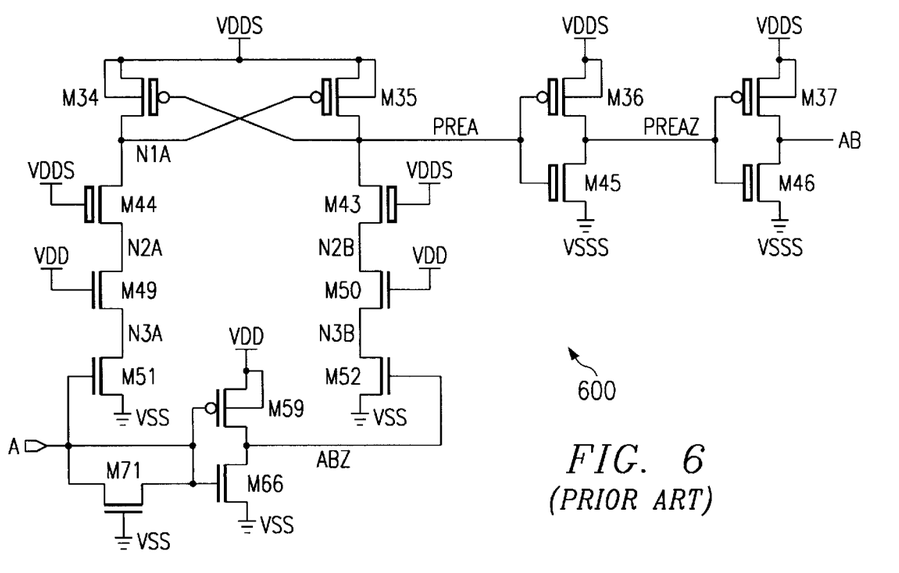
FIG. 6 is a schematic diagram of a prior art I/O section level shifter.

As a specific example, as shown in FIG. 6, level shifter 600 comprises high voltage transistors M43 and M44, and low voltage transistors M49 and M50. High voltage VDDS powers up first, turning on transistors M43 and M44. In the milliseconds before low voltage VDD powers up, the gates of transistors M49 and M50 remain low, causing stress on the gate oxide until VDD powers up and turns on transistors M49 and M50.

During the time VDDS is powered up without VDD, there is about a one volt drop from the gate to the source/drain of transistors M43 and M44. If VDDS is 5 volts, then there is about 4 volts at node N2A, and if the VDD gates are at 0 volts for transistors M49 and M50, then there is a stress of about 4 volts across the gate to the source/drain of transistors M49 and M50.

Figure 7:
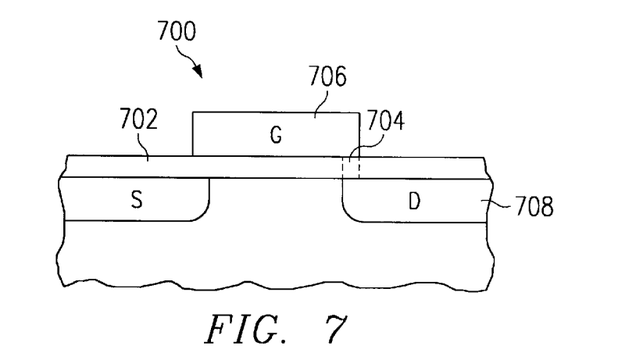
FIG. 7 is a cross sectional view of a transistor.

As shown in FIG. 7, gate oxide 702 of transistor 700 is very thin and is not designed to handle high voltage stress (e.g., 4 volts) for extended periods of time at point 704 between gate 706 and drain 708. Generally, the higher the voltage between the gate and the source/drain, the less time needed to break down and punch through the gate oxide and damage the device.

For power up, the voltage stress may eventually damage the device, and may be a problem if a device is power cycled more frequently than intended by the circuit designer. A potentially more significant problem is that it is sometimes desirable to power down the VDD voltage of an electronic device to save power, but this would destroy the low voltage transistors fairly quickly if the VDDS power supply remains on.

Figure 8:
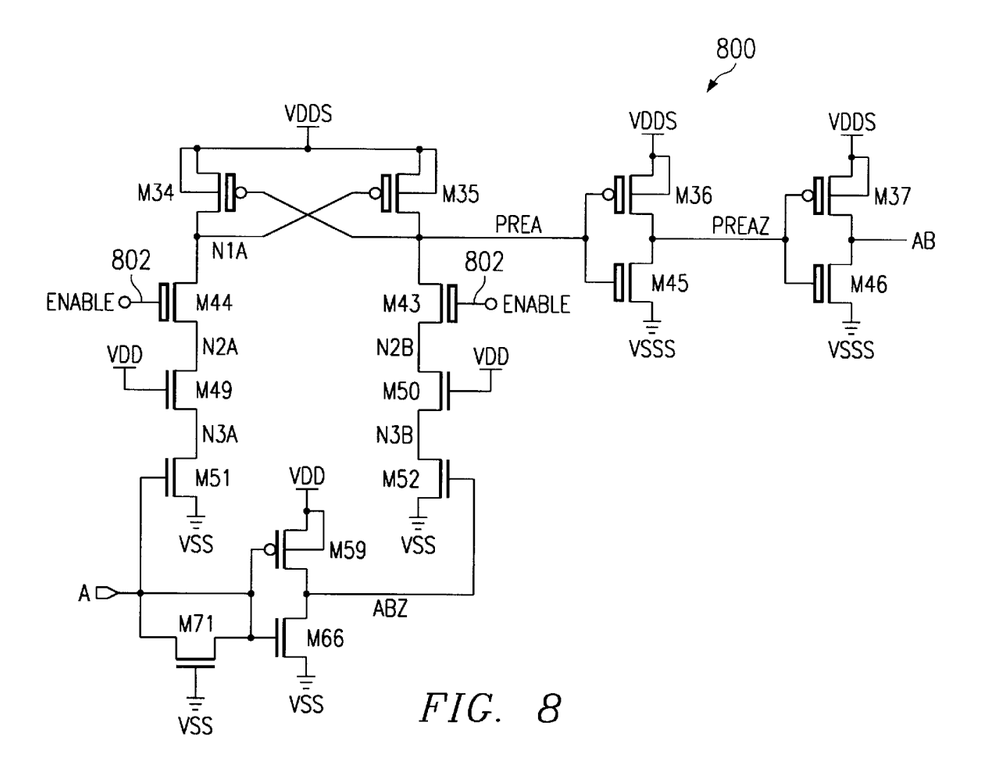
FIG. 8 is a schematic diagram of an enabled level shifter.

A solution to this problem is to implement enabled level shifter 800 as shown in FIG. 8. An enabled high voltage 802 (e.g., 3.3 or 5 volts) is connected to the gates of transistors M43 and M44 instead of VDDS directly. The enable signal basically disables M43 and M44 as a power down mode is entered. Because the transistors are disabled, there is no path or channel for a 5 volt signal to reach the drains of lower voltage transistors M49 and M50. Therefore the VDD voltage may be powered down safely. Because there is no voltage stress, the VDD voltage may generally be powered down for any length of time without damaging the transistors.

Although the present invention and its advantages have been described in detail, it should be understood that various changes, substitutions and alterations can be made herein without departing from the spirit and scope of the invention as defined by the appended claims. For example, the specific transistor implementation of the inventive circuits may be varied from the examples provided herein while still remaining within the scope of the present invention. As another example, p-type and n-type semiconductor regions may be switched, the source and drain of a MOS transistor may be switched, and other types of semiconductor processing technologies other than MOS may be used. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit (IC) having a core section and an input/output (I/O) section, said IC comprising:
    a clocked differential level shifter, wherein said differential level shifter receives differential data at a core voltage level and shifts the differential data from the core voltage level to an I/O voltage level to provide a differential data output at said I/O voltage level; and
    a clocked latch coupled an output of said level shifter, wherein said latch captures said data at said I/O voltage level.

2. The integrated circuit of claim 1, wherein said latch is a differential input latch receiving said differential data output from said differential level shifter.

3. The integrated circuit of claim 2, wherein said latch provides a single-ended data output.

4. The integrated circuit of claim 1, wherein an external clock received by said IC remains at said I/O voltage level for clocking said level shifter and said latch.

5. The integrated circuit of claim 1, wherein said level shifter shifts said data on one phase of an external clock and said latch captures data on an opposite phase of said external clock.

6. The integrated circuit of claim 1, wherein said core voltage level is 1.8 volts and said I/O voltage level is 3.3 volts.

7. The integrated circuit of claim 1, wherein said latch is a master flip-flop of a master/slave flip-flop pair.

8. The integrated circuit of claim 1, wherein said level shifter comprises I/O voltage level transistors coupled to core voltage level transistors, wherein gates of said I/O voltage level transistors are coupled to a clock, and wherein gates of said core voltage level transistors are coupled to said core voltage level.

9. The integrated circuit of claim 1, wherein said IC is an application specific IC (ASIC).

10. A method of providing data at an output of an integrated circuit (IC), said IC comprising a core section having a core voltage level and an I/O section having an I/O voltage level, said method comprising:
    level shifting said data differentially from said core voltage level to said I/O voltage level synchronous to an external clock; and
    latching said data at said I/O voltage level synchronous to said external clock.

11. The method of claim 10, further comprising latching said data differentially.

12. The method of claim 11, further comprising providing a single-ended data signal to said output after said latching.

13. The method of claim 10, wherein said external clock remains at said I/O voltage level for synchronizing said level shifting and said latching.

14. The method of claim 10, further comprising level shifting said data on one phase of said external clock and latching said data on an opposite phase of said external clock.

15. The method of claim 10, wherein said core voltage level is 1.8 volts and said I/O voltage level is 3.3 volts.

16. An integrated circuit (IC) having a core section and an input/output (I/O) section, said IC comprising:
    a clocked level shifter, wherein said level shifter shifts data from a core voltage level to an I/O voltage level, and further wherein said level shifter comprises I/O voltage level transistors coupled to core voltage level transistors, wherein gates of said I/O voltage level transistors are coupled to a clock, and wherein gates of said core voltage level transistors are coupled to said core voltage level; and
    a clocked latch coupled an output of said level shifter, wherein said latch captures said data at said I/O voltage level.

* * * * *